United States Patent [19]
Kawakubo et al.

[11] Patent Number: 5,863,680
[45] Date of Patent: Jan. 26, 1999

[54] EXPOSURE METHOD UTILIZING ALIGNMENT OF SUPERIMPOSED LAYERS

[75] Inventors: Masaharu Kawakubo; Ryoichi Kaneko, both of Kanagawa-ken, Japan

[73] Assignee: Nikon Corporation, Tokyo, Japan

[21] Appl. No.: 728,367

[22] Filed: Oct. 10, 1996

[30] Foreign Application Priority Data

Oct. 13, 1995 [JP] Japan ................................. 7-291917

[51] Int. Cl.$^6$ ..................................................... G03F 9/00
[52] U.S. Cl. ............................................... 430/22; 430/30
[58] Field of Search ........................................ 430/30, 22

[56] References Cited

U.S. PATENT DOCUMENTS

| | | | |
|---|---|---|---|
| 4,833,621 | 5/1989 | Umatate | 364/491 |
| 5,451,479 | 9/1995 | Ishibashi | 430/22 |

Primary Examiner—Christopher G. Young
Attorney, Agent, or Firm—Armstrong, Westerman, Hattori, McLeland & Naughton

[57] ABSTRACT

Disclosed is an exposure method for exposing an image of a pattern formed on a mask to plural layers superimposed upon a substrate, comprising: the step of storing an alignment error between the plural layers together with at least one of exposure data and alignment data; the step of setting alignment data upon exposing another pattern to the substrate on the basis of at least one of the exposure data and alignment data; and the step of displacing the mask and the substrate relative to each other on the basis of the alignment data set in the previous step. There is further disclosed an exposure apparatus for exposing an image of a pattern formed on a mask to plural layers superimposed upon a substrate, comprising a storage for storing alignment errors between the plural exposure layers together with at least one of exposure data and alignment data; and a control unit connected to the storage for setting alignment data upon exposing another pattern to the substrate on the basis of at least one of the exposure data and alignment data; wherein the control unit controls the mask and the substrate so as to be displaced relative to each other on the basis of the alignment data set.

8 Claims, 5 Drawing Sheets

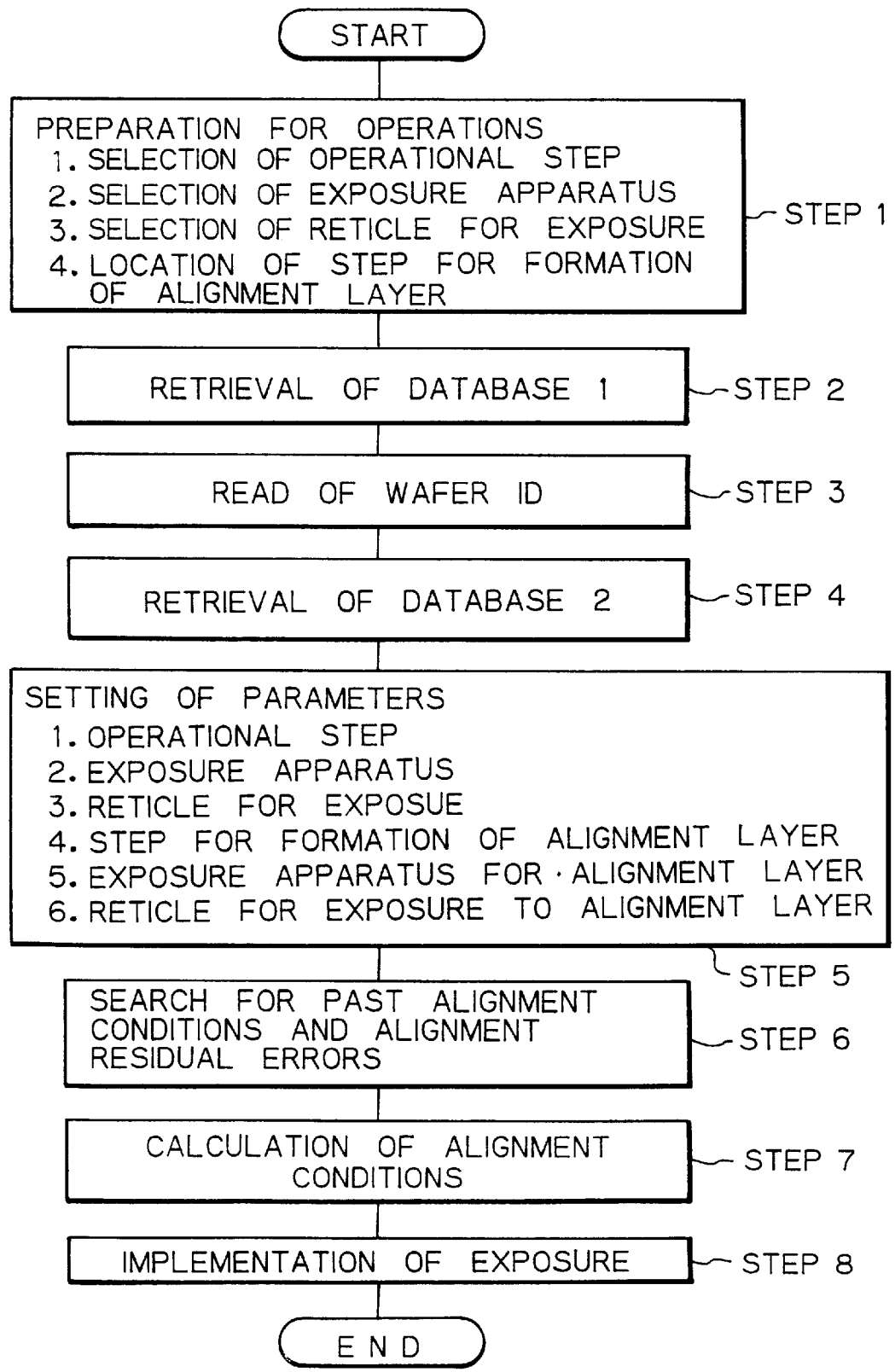

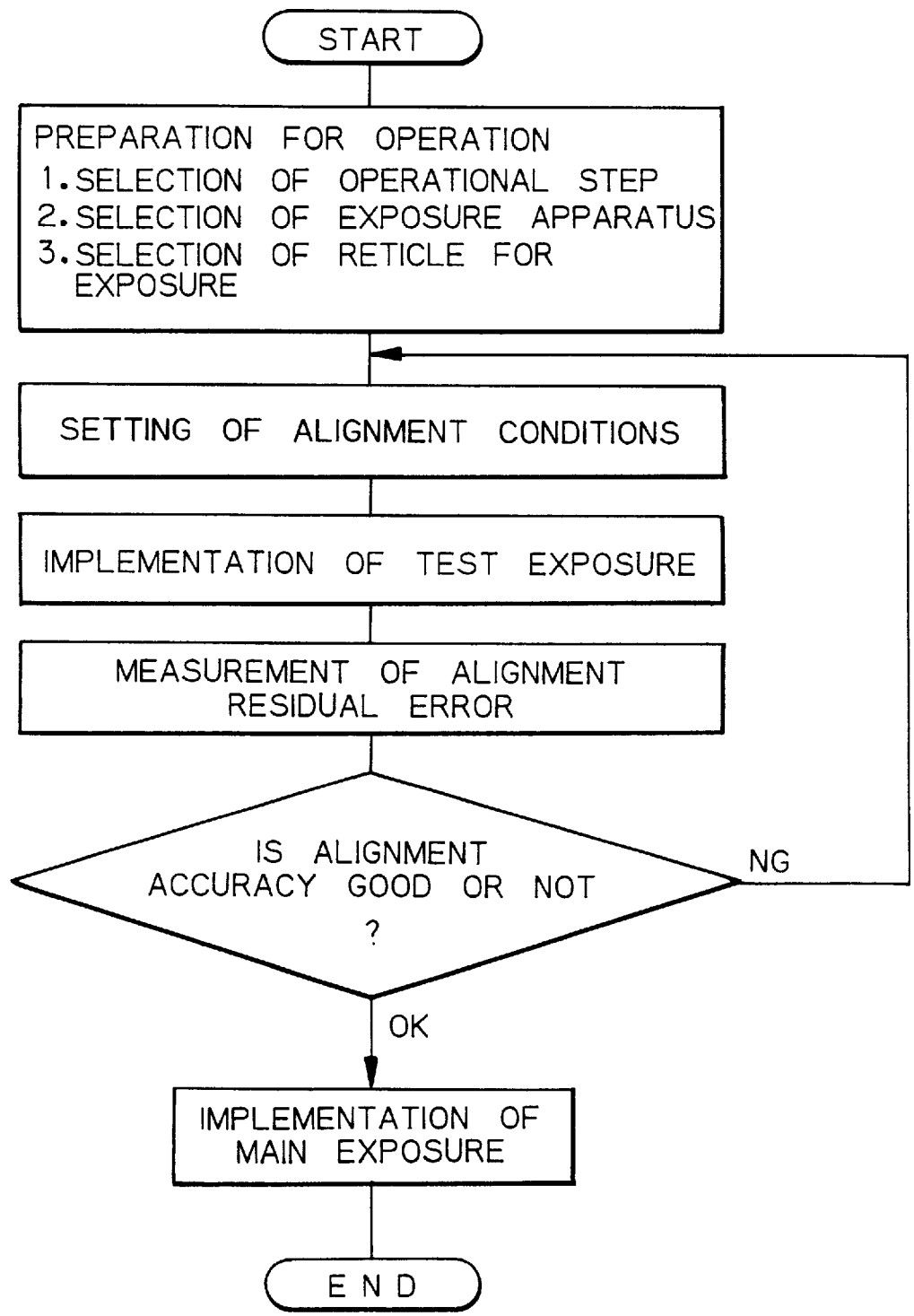

EXPOSURE METHOD UTILIZING ALIGNMENT OF SUPERIMPOSED LAYERS

BACKGROUND OF THE INVENTION

1. Field of The Invention

The present invention relates to an exposure method and an exposure apparatus and, more particularly, to an exposure method and an exposure apparatus for forming an image of a pattern of a mask on an uppermost layer of a substrate by aligning a pattern formed on a given layer of the substrate with a pattern on the mask.

2. Description of the Related Art

In a method for forming plural patterns in layers superimposed on a substrate by exposure to light, an upper-most layer of the layers superimposed on the substrate is generally formed with a new pattern by aligning the new pattern with one of the previous patterns already formed in the layers on the substrate.

For comparative purposes, an example of conventional exposure methods will be described with reference to FIG. 5 illustrating such a conventional exposure method, a first step of which comprises a selection of operation steps, an exposure apparatus and an exposure reticle as a preparation step for operations. Then, a substrate is aligned under alignment conditions and subjected to test exposure to light (pilot or pre-processing), followed by a measurement of an alignment residual error of the substrate exposed to light by a given measurement device. As a result of the test exposure, when it is found that the alignment residual error for the substrate is within a given reference value, a main exposure is carried out. On the other hand, if the alignment residual error for the substrate is found to be outside the given reference value, the alignment conditions are changed on the basis of the alignment residual error measured and the substrate is aligned again under the renewed alignment conditions, followed by the implementation of a main exposure step or the re-implementation of a test exposure step.

In the conventional process as described hereinabove, the alignment conditions may change, too, when conditions for exposing the substrate to light changes. In other words, alignment conditions may also change in each case where an operation step is changed, where a different exposure apparatus is used, where a different reticle for allowing the substrate to be exposed to light is employed, where a substrate is changed for a test exposure, where there is used a different device for exposing an alignment layer with a mark formed as a reference of alignment or where a reticle used for exposure of the alignment layer is changed. In order to sustain a high level of accuracy in alignment, the conventional process requires the test exposure to be conducted again, whenever alignment conditions change. This results in a reduction of throughput.

In order to solve problems and disadvantages encountered with such conventional exposure methods, extensive review and studies have been made to develop an exposure method that can improve throughput of an exposure apparatus while sustaining a high level of accuracy in alignment.

SUMMARY OF THE INVENTION

Therefore, the present invention has the object to provide an exposure method that can improve throughput of an exposure apparatus while sustaining a high level of accuracy in alignment.

It is another object of the present invention to provide an exposure apparatus capable of carrying out the exposure method as described hereinabove.

In order to achieve the above object, the present invention provides an exposure method which comprises storing an alignment error between patterns formed in plural layers superimposed on a substrate so as to correspond with conditions relating to exposure to light and alignment for each of the plural layers; reading an alignment error and an alignment condition corresponding thereto from at least one of the plural layers storing the alignment errors corresponding each to an exposure condition set for an uppermost layer superimposed on the substrate; calculating an alignment condition for the uppermost layer on the basis of information read; and aligning at least one pattern on the substrate with the pattern on the mask in accordance with the alignment condition calculated hereinabove. In a preferable aspect of the exposure method according to the present invention, at least a portion of the conditions relating to exposure to light and alignment for every layer is formed on each layer as an identification code.

The present invention further provides an exposure apparatus for exposing an image of a pattern formed on a mask to each of plural exposing layers superimposed upon a substrate, comprising a storage means for storing an alignment error between patterns formed in plural layers superimposed on a substrate so as to correspond to exposure and alignment conditions for each of the plural layers; an operation means for reading an alignment error and an alignment condition corresponding thereto from at least one of the plural layers storing the alignment errors corresponding each to an exposure condition set for an uppermost layer of the layers superimposed on the substrate and for calculating an alignment condition for the uppermost layer on the basis of data read; and an alignment means for aligning at least one pattern on the substrate with the pattern on the mask in accordance with the alignment condition calculated hereinabove.

In a preferred aspect of the exposure apparatus according to the present invention, the alignment means is provided with an alignment mark detection system for photoelectrically detecting a ray of light emitting from an alignment mark formed in at least one pattern on the substrate by illuminating the alignment mark and it is disposed so as to allow the mask to move relative to the substrate or vice versa in accordance with an output from the alignment mark detection system and the alignment condition calculated. The alignment means may also be provided with a means for recording at least a portion of the exposure and alignment conditions for the uppermost layer of the substrate in the uppermost layer thereof, causing a reader means to optically read the recorded conditions and transmitting the read conditions to the operation means.

With the arrangement of the exposure apparatus in the manner as described hereinabove, the present invention can calculate a new alignment condition by making a search for and retrieving the past alignment conditions in an appropriate fashion. Accordingly, even if exposure conditions and the like for a substrate would change, the exposure apparatus according to the present invention does not require any new test exposure and can calculate a new alignment condition, unlike the conventional exposure apparatuses. This can, as a matter of course, make a period of time required for determining the alignment condition remarkably shorter as compared to conventional techniques.

Other objects, features and advantages of the present invention will become apparent in the course of description that follows, with reference to the accompanying drawings.

BRIEF DESCRIPTION OF THE DRAWINGS

FIG. 4 is a flowchart showing an exposure method according to an example of the present invention.

FIG. 5 is a flowchart showing a conventional exposure method.

DESCRIPTION OF THE PREFERRED EMBODIMENTS

Figure 1:
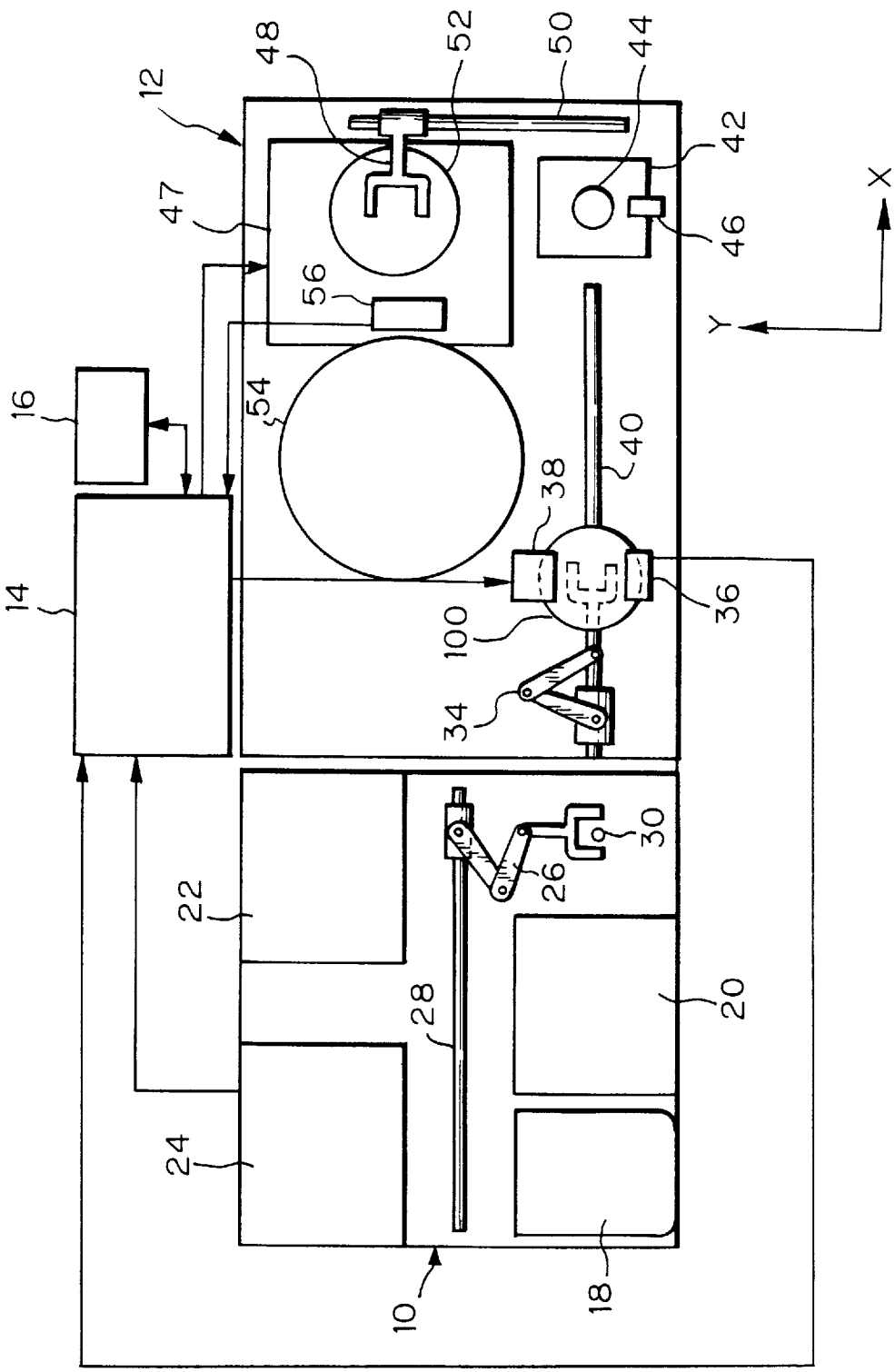
FIG. 1 is a schematic view showing an exposure system according to an example applied to the present invention.

The present invention will be described in more detail by way of examples with reference to the accompanying drawings. This example is directed to an application of an embodiment of the present invention to a semiconductor projection exposure system for projection exposing a pattern formed on a reticle to a wafer.

A description will first be made of an exposure system according to the example with reference to FIG. 1. The exposure system comprises a coater developer unit 10, an exposure unit 12 for exposing a wafer 100 to light, a main control unit 14 for controlling an entire system comprehensively, and a storage 16 connected to the main control unit 14.

The coater developer unit 10 comprises a wafer cassette 18 for storing a plurality of wafers, a coater 20 for coating a surface of the wafer with a photoresist, a developer 22 for developing the wafer 100 after exposure, an inspection unit 24 for measuring an alignment error of the wafer 100 after development, an articulated robot arm 26 for conveying the wafer 100, and a guide rail 28.

The exposure unit 12 comprises an articulated robot arm 34 for delivering and receiving the wafer 100 to and from the coater developer unit 10, a bar-code reader 36 for reading a bar code formed on the wafer 100, a laser processor 38 for forming the bar code provided on the wafer 100, a prealignment unit 42, and exposure units 47, 52, 54 and 56. The prealignment unit 42 has a turntable 44 for rotating the wafer 100 loaded thereon, and a sensor 46 for sensing an orientation flat of the wafer 100. The wafer 100 is carried and delivered to the prealignment unit 42 by the articulated robot arm 34 disposed so as to move on and along a guide 40. The delivery of wafers between the prealignment unit 42 and the exposure unit 12 is conducted by a slider arm 48 disposed so as to slide on and along the guide 50.

As shown in FIG. 1, one of the plural wafers stored in the wafer cassette 18 is taken by the articulated robot arm 26 and the wafer 100 is then conveyed to the coater 20. The wafer 100 is coated at its surface with a photoresist by the coater 20 and then conveyed to a waiting position 30 by the articulated robot arm 26. The wafer 100 is held at its waiting position 30 by the articulated robot arm 34 mounted on the exposure unit 12 and conveyed to the bar-code reader 36 for reading an identification code, such as a bar code, provided in each layer on the wafer 100. The bar-code reader 36 transmits to the main control unit 14 information read which contains conditions of exposure and alignment at the time of the formation of a pattern on each layer.

The robot arm 34 further moves on and along the guide 40 and delivers the wafer 100 to the turntable 44 of the prealignment unit 42. The prealignment unit 42 irradiates a parallel illumination flux of a non-exposing wavelength onto an outer peripheral portion of the wafer 100 by the sensor 46 while rotating the wafer 100 by the turntable 44. The illumination flux which is not blocked by the wafer 100 is photoelectrically detected. The rotation of the turntable 44 is suspended in accordance with output from the sensor 46, and the orientation flat of the wafer 100 is aligned with a given direction. The wafer 100 is then conveyed to a position above a wafer stage 47 by the slider arm 48 and allowed to be attached by vacuo to a wafer holder 52.

On each of the plural layers of the wafer 100 is formed a pattern in a superimposed fashion and an alignment mark provided on at least one pattern formed on the plural layers is detected by an alignment sensor 56. Then, the main control unit 14 drives the wafer stage 47 on the basis of output from the alignment sensor 56 and a given correction amount (an alignment condition) to align a pattern on the wafer 100 with a pattern of the reticle. Thereafter, the main control unit 14 exposes the uppermost layer of the wafer 100, namely, a photoresist layer provided thereon, to an image of the pattern on the reticle through a projection optical system 54. A method for the calculation of the alignment condition for the wafer 100 will be described hereinafter.

After all the shot areas (patterns) of the wafer 100 are exposed so as to allow the pattern images of the reticle to be superimposed thereupon, the wafer 100 is then transferred from the wafer stage 47 by the slider arm 46 and delivered to the robot arm 34. Then, the robot arm 34 conveys the wafer 100 to the laser processor 38 for recording the conditions relating to exposure and alignment at the uppermost layer of the wafer 100. The laser processor 38 irradiates laser beams having a wavelength range capable of photosensitizing the photoresist coated on the uppermost layer onto the wafer 100, thereby writing the exposure and alignment conditions on the uppermost photoresist layer of the wafer 100 in the form of bar codes, numerals or alphabets.

The wafer 100 with various conditions recorded thereon is conveyed to the waiting position 30 by the robot arm 34 and then to the developer 22 by the robot arm 26. The inspection unit 24 detects rays of light emitting from the wafer 100 by illuminating each of some shot areas and the light is detected photoelectrically by an image pick-up element such as a CCD. Further, image signals from the image pick-up element are scanned by plural scanning lines, thereby measuring an alignment error of alignment of the pattern formed in at least one of the layers on the wafer 100 with the pattern (resist pattern) to be formed on the uppermost layer upon exposure by the exposure unit 12. The measurement results are transmitted to the main control unit 14.

Figure 2:
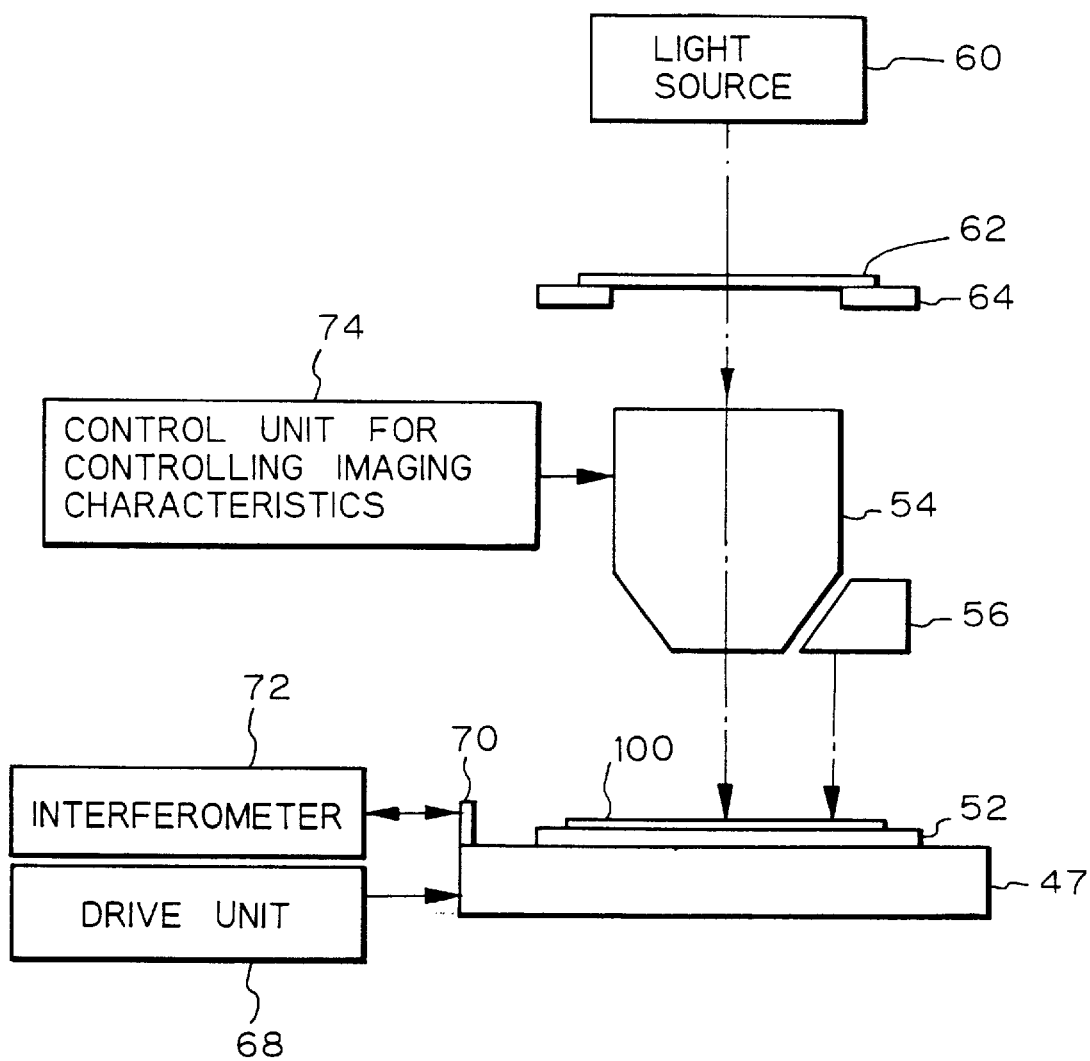
FIG. 2 is a schematic view showing an essential part of the exposure system of FIG. 1.

FIG. 2 shows the configuration of the exposure section of the exposure unit 12. The light for exposure emitted from an exposing light source 60 illuminates a reticle 62 held with a reticle stage 64. The reticle 62 is formed with a given circuit pattern which in turn is projected onto the wafer 100 with the projection optical system 54. The wafer stage 47 is disposed so as to be step-movable in both x- and y-directions by a stage drive system 68. The alignment sensor 56 photoelectrically detects an alignment mark (not shown) provided in the shot area of the wafer 100 at a position deviated by a given amount from an optical axis of the projection optical system 54. On the wafer stage 47 is fixed a reflecting mirror 70 which in turn reflects a ray of light emitted from an interferometer 72. The light reflected from the reflecting mirror 70 is received by the interferometer 72 and detects the position of the wafer stage 47. To the projection optical system 54 is connected a control unit 74 for controlling imaging characteristics.

Figure 3:
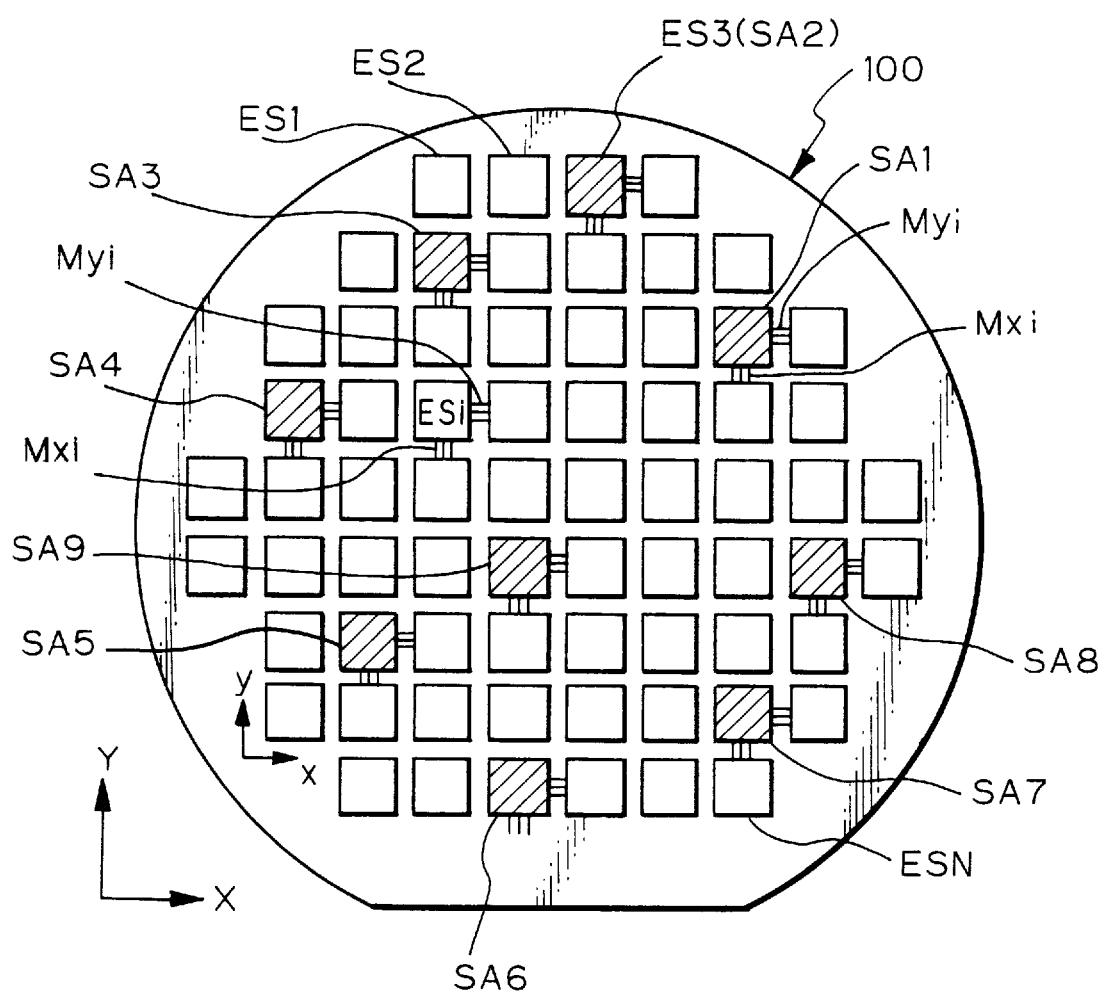
FIG. 3 is a plane view showing a wafer to be used for the exposure system of FIG. 1.

FIG. 3 shows a shot sequence of the wafer 100. In a street line of plural shot areas ES1 through ESN of the wafer 100 are provided alignment marks Mxj and Myi in a lattice form to be detected photoelectrically by the alignment sensor 56. In this example, the wafer is aligned by a so-called EGA (enhanced global alignment) system. In other words, sample areas SA1 through SA9 are selected from the plural shot areas ES1 through ESN and alignment marks provided in these sample areas SA1 through SA9 are detected. The coordinates (x, y) of the shot sequence are determined statistically by the least square.

Then, a description will be made of the method for exposing the wafer 100 to light with reference to the flowchart as shown in FIG. 4. The exposure method according to the present invention may be carried out on the basis of data stored in two databases as will be described hereinafter, namely, database 1 and database 2. The storage 16 stores, as the database 1, alignment residual errors measured by the inspection unit 24 after exposure and conditions of exposure and alignment upon exposure.

The contents of the database 1 are as follows:

1. Names of operation steps;
2. Names of exposure apparatuses;
3. Names of reticles;
4. Names of steps for forming alignment layers;
5. Names of exposure apparatuses for exposing the alignment layers;
6. Names of reticles for exposing the alignment layers;
7. Alignment conditions; and
8. Alignment residual errors.

By the term "alignment layer" referred to herein is meant a layer formed on the wafer 100 on which the alignment mark to be used herein is provided.

As the alignment conditions, there may be used correction parameters as will be described hereinafter. The correction parameters include correction parameters for correcting the coordinates of sequences of shot areas of the wafer 100 as follows:

1. Offset (x, y);
2. Scaling (x, y);
3. Orthogonal degree; and
4. Wafer rotation.

The correction parameters within each of the shot areas further include correction parameters as follows:

5. Shot magnification; and
6. Shot rotation.

In each layer superimposed on the wafer was recorded a wafer ID for each of the exposing steps as database 2 which in turn includes the contents as follows:

1. Names of operation steps;
2. Names of exposure apparatuses; and
3. Names of reticles for exposure.

These data may be recorded in a wafer unit or in a lot unit consisting of plural wafers.

In the exposure method according to the example of the present invention, the main control unit 14 selects an operation step, an exposure apparatus and a reticle for exposure, as a preparatory procedure, and then locates a step for forming an alignment layer, prior to the alignment of the wafer 100 (step 1). Then, the main control unit 14 retrieves the contents of the database 1 stored in the storage 16 (step 2). Further, the main control unit 14 gives an instruction to the bar-code reader 36 which in turn reads the wafer ID to be exposed therein from the database 2 (step 3), followed by retrieving the database 2 (step 4). The main control unit 14 now has both the databases 1 and 2 read therein. It can be noted herein that when the name of the operation step corresponds to the name of the step for forming the alignment layer in a one-to-one manner, it is not required to locate the step for forming the alignment layer in the preparation for operations.

The main control unit 14 then sets the following parameters on the basis of the data read therein from the databases 1 and 2 (step 5).

1. Name of the operation step;
2. Name of the exposure apparatus;
3. Name of the reticle for exposure;
4. Name of the step for forming the alignment layer;
5. Name of the exposure apparatus for exposing the alignment layer; and
6. Name of the reticle for exposing the alignment layer.

Thereafter, the main control unit 14 searches for the past alignment conditions and alignment residual errors corresponding to the above six parameters from the database 1 stored in the storage 16 (step 6). In this search process, it is not necessary to search for all the past data as a search condition and it may be one such as n pieces of latest data or data saved in latest n hours (or days or months). From a mean value of the data for which the search has been made and which has been retrieved, the main control unit 14 calculates new alignment conditions (correction parameters) for the wafer 100 to be exposed from the formula as follows (step 7):

New alignment conditions=corresponding past alignment conditions minus corresponding past alignment residual error.

The new alignment conditions may also be calculated from the coordinates system of a vernier measurement instrument as follows:

New alignment conditions=corresponding past alignment conditions plus corresponding past alignment residual error.

Then, the main control unit 14 corrects information on the position of the wafer 100 detected by the alignment sensor 56 and implements the alignment process in accordance with the new alignment conditions as calculated above. More specifically, the wafer stage 47 is driven by the drive unit 68 and the projection magnification of the projection optical system 54 is controlled by the control unit 74 for controlling the imaging characteristics. The wafer 100 is transferred by the drive unit 68 while the position of the wafer stage 47, namely, the position of the wafer 100, is being monitored by the interferometer 72. After the alignment has been completed, the main control unit 14 then exposes an image of the pattern on the reticle 62 to the shot areas ES1 to ESN of the wafer 100 one after another through the projection optical system 54 (step 8).

It is to be noted herein that the main control unit 14 writes the current exposure and alignment conditions on the wafer 100 through the laser processor 38.

In this example as described hereinabove, the main control unit 14 is disposed so as to control one set of the coater developer unit 10 and the exposure unit 12. It can also be noted herein that it may be disposed so as to control plural sets of the coater developers 10 and the exposure units 12. More specifically, the main control unit 14 can be arranged to control a different exposure unit so as to superimpose a new pattern upon the currently exposed layer and to expose the new pattern to the currently exposed layer on the basis of the current exposure and alignment conditions as well as alignment error.

Although the present invention is described hereinabove on the basis of the examples, it should be understood that it is not limited in any respect to the examples as described hereinabove and it is interpreted as encompassing any modifications and variations from the gist of the present invention within the scope and spirit of the present invention.

The present invention can present the advantages that the time required for determining the alignment conditions can be shortened, thereby improving throughput because the past alignment conditions and alignment errors are stored for each layer to be superimposed on a substrate, the past alignment conditions and alignment residual error, corresponding to the exposure conditions for a layer superimposed on the substrate to be newly exposed, are read from the information stored, and new alignment conditions can be determined on the basis of the information read.

What is claimed is:

1. A method for exposure of an image of a pattern formed on a mask superimposed on a substrate, comprising the steps of:

storing an alignment error of plural exposure layers superimposed upon said substrate together with at least one of exposure data and alignment data;

setting alignment data upon exposing a next pattern on said substrate on the basis of said alignment error; and transferring said mask and said substrate relative to each other on the basis of the set alignment data.

2. The method of exposure as claimed in claim 1, further comprising the step for recording the set alignment data.

3. The method of exposure as claimed in claim 2, wherein the set alignment data is recorded in said substrate.

4. The method of exposure as claimed in claim 1, wherein said exposure data contains data of an exposure apparatus used for exposure and data of the mask used for exposure.

5. The method of exposure as claimed in claim 1, wherein said alignment data contains, as a correction parameter for correcting an exposure area, at least one of offset data, scaling data, orthogonal data and rotation data.

6. The method of exposure as claimed in claim 1, wherein said alignment data contains exposure magnification as a correction parameter.

7. A device manufactured by the method of exposure as claimed in claim 1.

8. The method of exposure according to claim 1, wherein said exposure is carried out with a plurality of exposure apparatuses.

* * * * *